United States Patent
Chazelas et al.

(10) Patent No.: US 6,383,305 B1
(45) Date of Patent: May 7, 2002

(54) METHOD FOR THE MAKING SOLDERING FLUX AND RESULTING WELD JOINT

(75) Inventors: Jean Chazelas, Paris; Olivier Prevotat, Buc; Jean-François Silvain, Talence Cedex; Sandrine Trombert, Gradignan, all of (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/581,224

(22) PCT Filed: Dec. 23, 1998

(86) PCT No.: PCT/FR98/02855

§ 371 Date: Jun. 23, 2000

§ 102(e) Date: Jun. 23, 2000

(87) PCT Pub. No.: WO99/33604

PCT Pub. Date: Jul. 8, 1999

(30) Foreign Application Priority Data

Dec. 23, 1997 (FR) .............................. 97 16349

(51) Int. Cl.[7] .............................. B23K 35/34
(52) U.S. Cl. .................... 148/24; 148/402; 228/248.5
(58) Field of Search ................ 148/24, 402; 228/248.1, 228/248.5

(56) References Cited

U.S. PATENT DOCUMENTS

| | | | | | |
|---|---|---|---|---|---|
| 4,431,465 A | * | 2/1984 | Mizuhara et al. | ............. | 148/24 |
| 4,740,252 A | * | 4/1988 | Hasegawa et al. | ............. | 148/24 |
| 5,965,197 A | * | 10/1999 | Jin et al. | .................... | 427/180 |
| 5,971,253 A | * | 10/1999 | Gilleo et al. | ........... | 228/180.22 |

FOREIGN PATENT DOCUMENTS

| | | | | |
|---|---|---|---|---|
| FR | 2706139 | * | 12/1994 | |
| GB | 1590695 | * | 6/1981 | |
| WO | 90/04490 | * | 5/1990 | |

* cited by examiner

*Primary Examiner*—George Wyszomierski
(74) *Attorney, Agent, or Firm*—Oblon, Spivak, McClelland, Maier & Neustadt, P.C.

(57) ABSTRACT

To improve the resistance of a solder to strains, especial thermal strains, superelastic particles are incorporated into the solder in a proportion by volume of 10 to 30% approximately. So that this incorporation can be done, the particles are coated with a metal, for example copper, that is wettable by the solder.

19 Claims, 1 Drawing Sheet

METHOD FOR THE MAKING SOLDERING FLUX AND RESULTING WELD JOINT

The present invention relates to a method for the making of solder paste and to a solder joint obtained by this method.

The applications and performance characteristics of electronics are calling for increasingly efficient, compact and reliable electronic systems. These large-scale integration requirements are based on the use of miniaturized components and appropriate joining methods. The most widespread joining method entails the use of soldering to form joints between the component and the interconnection substrate. The soldered joint has three main functions: electrical interconnection, mechanical assembly and the transfer of heat from the component to the interconnection substrate which, most commonly, is a printed circuit. Now, there is a great difference between the coefficients of thermal expansion (CTE) of the electronic component and of the printed circuit (see FIG. 1). When there are temperature variations due to internal or external causes, the differences in expansion between the two elements induce strains that give rise to cracks. These cracks spread and cause the joint to break and the equipment is thus put out of operation.

An object of the invention is a solder paste that can be used to absorb the strains due especially to differences in CTE between the elements that it serves to join by soldering, and that does so throughout the lifetime of these elements, these strains possibly being high amplitude strains that can vary in substantial proportions, the joint that is made with this solder paste entailing no increase in cost, mass or volume, necessitating no modification of the architecture of the printed circuit, placing no limits on the performance characteristics of the circuits thus made, and permitting repairs An object of the invention also is a method for the manufacture of a solder paste of this kind that is simple to implement and can be used to obtain a paste of homogeneous and constant quality.

The solder paste according to the invention comprises a metal matrix in whose volume particles of superelastic alloy are distributed substantially homogeneously, these particles having a substantially spherical shape with a diameter advantageously ranging from 1 to 50 $\mu$m approximately and representing 5 to 30% of the total volume of the paste. These particles are advantageously made of SMA (shape memory alloy).

The method of the invention consists in incorporating substantially spherical particles made of superelastic material into a matrix of solder after having coated these particles with a material that is wettable by the material of the solder, these particles being advantageously coated with a flux.

The present invention will be understood more clearly from the following detailed description of two exemplary embodiments taken as non-restrictive examples and illustrated by the appended drawing, wherein.

The invention is described here below with reference to the soldering of an electronic component to a printed circuit with a different CTE, but it is clear that it is not limited to this application alone and that it can be implemented whenever it is necessary to do a soldering capable of absorbing strains, whatever the cause of these strains (different values of CTE, vibrations, shocks, etc.), if there is a risk that these strains might damage at least one of the elements joined by this soldering.

Figure 1:
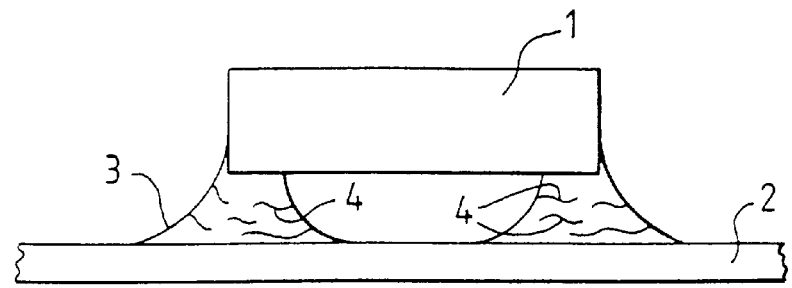
FIG. 1 is a simplified front view of a component soldered in a known way to a standard printed circuit.

The component 1 shown in FIG. 1 which is, for example, a ceramic dielectric capacitor is soldered to a printed circuit 2 by means of standard solder joints 3. In this example, the component 1 has a lower CTE than that of the printed circuit 2. Owing to the heat strains, the joints 3 have cracks 4 that embrittle the attachment of the component 1 to the circuit 2.

Figure 2:
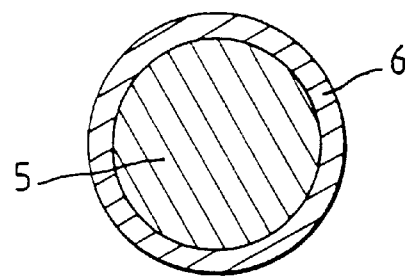
FIG. 2 is a sectional view of a superelastic particle of the kind used for the soldering paste of the invention.

FIG. 2 shows a particle of superelastic material, as prepared according to the invention so that it can enter into the composition of the soldering paste of the invention. This particle 5 has a substantially spherical shape and its diameter ranges for example from 1 $\mu$m to about 10 $\mu$m. This particle 5 is coated according to the method explained here above with a metal coating 6, made of copper for example, with a thickness preferably lower than 1 $\mu$m approximately. The particle 5 is for example constituted by one of the following alloys: Ni—Ti (50/50 by atomic proportion), Cu—Zn—Al, Cu—Al—Ni.

Figure 3:
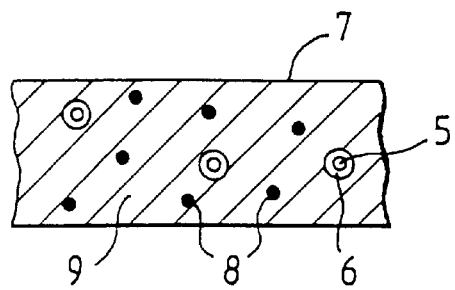
FIG. 3 is a schematic sectional view of a solder paste according to the invention.

FIG. 3 gives a schematic sectional view of a piece 7 of a mixture used to obtain the solder paste according to the invention. This mixture has superelastic particles 5 and particles 8 of standard solder distributed as uniformly as possible in a flux 9.

Figure 4:
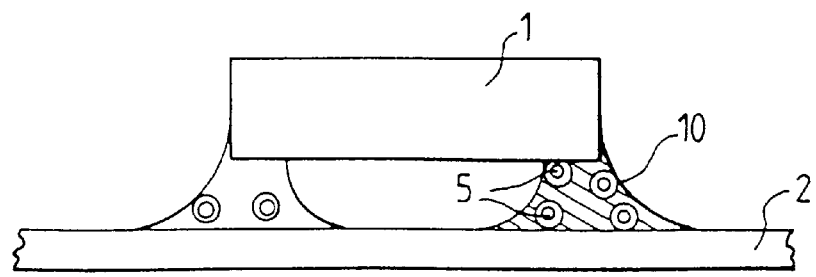
FIG. 4 is a simplified front view of a component soldered according to the invention to a standard printed circuit, the joint being seen in a sectional view.

FIG. 4 shows the component 1 fixed to the printed circuit 2 by soldering according to the invention. The solder joint 10, as shown schematically in FIG. 4, has superelastic particles 5 distributed as uniformly as possible within the paste.

A detailed explanation shall now be given of the method for making solder paste according to the invention. This solder paste is essentially constituted by a metal matrix with a low melting point (approximately 190° C. to 200° C. approximately, for example) and particles made of an alloy with superelastic properties, having a melting point higher than that of the matrix. Advantageously, for the soldering of electronic components, an SnPbAg matrix with proportions by mass of 62/36/2 is used. The particles are advantageously made of a shape memory alloy (SMA), for example Ni—Ti with an atomic proportion of 50/50 (whose melting point is about 1310° C.). However, it will be noted that the SMAs are used not for their shape memory properties but for their superelastic properties (of reversible deformation). As specified here above, the prior art proposes no approach to the homogeneous integration of the superelastic particles in a metal matrix, because the wettability of this type of particle by the material of the matrix is almost zero. The method of the invention provides a solution to this problem.

The first main step of the method of the invention consists in depositing a wetting agent on the surface of the superelastic particle. This deposition can be done either chemically or electrolytically. First, the chemical method shall be described.

The superelastic particles are first of all cleaned, if necessary by means of an acid solution, and then rinsed if necessary (this treatment is not necessary if the particles are cleaned beforehand by the manufacturer and packaged in sealed flasks under inert gas, and if they are used immediately after the flask is opened). Then, the surface of the particles is sensitized by the formation of aggregates, for example aggregates made of tin-palladium. Aggregates of this kind may be formed by chemical deposition in one or two baths of tin chloride or palladium chloride for a period of less than 2½ minutes. This deposition can be done at ambient temperature. The composition of these baths is for example as indicated in a private communication by J. COLETO, INASMET (San Sebastian). We may also refer to two other communications: H. M. CHENG, et al., Plating & Surface Finishing, 77, 1990, and S. G. WARRIER et al., Journal of Materials Science, 28, 1993. The particles thus sensitized can then be rinsed.

Then, a chemical deposition is made of metal wettable by the solder, such as copper. In the case of copper, the particles are plunged into a copper sulfate bath and shaken, for example by ultrasonic means, so that the particles do not get agglomerated. This enables each particle to be individually coated with copper and, if necessary, the particles thus coated can be rinsed after being passed through the bath. For a copper thickness of about 1 µm, the period of stay in the bath should not exceed 2.5 minutes. The composition of the bath may be as indicated by J. COLETO. The particles are then dried in a neutral atmosphere at a temperature of below 70° C. and immediately stored in a neutral atmosphere. These coated particles are similar to those shown in FIG. 2.

The following main step consists in integrating the metal-coated superelastic particles into a matrix to form the solder paste. In order that this paste may be homogenous and used on an industrial scale, these particles are first of all coated with a flux selected for its viscosity and anti-oxidation properties. This flux may be of different known types: inorganic, non-resinous organic or resinous organic. The superelastic particles coated with flux are mixed with the particles of solder by mechanical mixing, for example in a mixer known as a "3D" mixer (a mixer enabling continuous 3D motion of the receptacle containing the powders and substances to be mixed). When the mixture is sufficiently homogeneous, as shown schematically in FIG. 3, the solder paste is ready for use. It is used as a standard solder paste, the solder temperature being slightly higher than the melting point of the matrix. This solder paste can be used to make joints (see FIG. 4) whose characteristics are optimal and lengthen the lifetime of electronic equipment comprising components that are soldered in this way to the printed circuits that they contain. The superelastic particles do not melt during the soldering and are therefore always present in particle state in the solder joint, thus forming a metal/metal composite.

To give an idea of the properties of the solder joint thus made, it was found, by measurement during tensile tests, that a joint of this kind comprising 4% by volume of superelastic particles made of NiTi coated with copper (with a thickness of about 1 µm) in a matrix SnPbAg (in a proportion by mass of 62/3612) has an elongation at tear that is practically double that of the same matrix without superelastic particles. The incorporation of a varying quantity of superelastic particles in the material makes it possible to control the characteristics of the solder joint. The effects of these particles are already perceptible for a small proportion of particles (a few points per cent), and can rise to about 30%.

According to variants of the method of the invention, the superelastic particles may be coated with a metal other than copper, for example Ni, Au, Ag, Sn, Pb or other metals or alloys that can be used to obtain sufficient wettability of these particles by the material of the matrix. In this case, the chemical deposition baths are adapted accordingly.

As indicated here above, the metal deposition on the particles can be done by electrolysis, for example as follows.

If necessary, the particles are cleansed and rinsed (as in the case of chemical deposition). Then, the copper (or any other appropriate wetting metal) is deposited in an electrolytic cell having its electrolyte based on copper sulfate and its anode made of copper. The electric contact by which the powder of particles can play its cathode role is made for example by centrifugation or periodic shaking of the cathode which has the form of a screen. The particles thus coated are then, if necessary, rinsed and then dried in a neutral atmosphere at a temperature of less than 70° C. and immediately stored in a neutral atmosphere. The following steps are the same as those described here above with reference to the chemical deposition process.

What is claimed is:

1. A solder paste including a matrix comprising a metal solder; and particles distributed substantially homogeneously in the matrix, wherein the particles comprise a superelastic alloy;

the particles are coated with a metal coating; and the metal coating is wettable by the metal solder.

2. The solder paste according to claim 1, wherein the particles are substantially spherical and have a diameter of about 1 to 50 µm.

3. The solder paste according to claim 1, wherein the particles represent about 5 to 30% of the total volume of the paste.

4. The solder paste according to claim 1, wherein the superelastic alloy is a shape memory alloy.

5. The solder paste according to claim 4, wherein the shape memory alloy contains Ni and Ti; Cu, Zn and Al; or Cu, Al and Ni.

6. The solder paste according to claim 1, wherein the metal coating comprises a metal selected from the group consisting of Cu, Ni, Au, Sn, Ag and Pb.

7. The solder paste according to claim 6, wherein the metal coating has a thickness of about 1 µm or less.

8. A method of making the solder paste of claim 1, the method comprising providing particles comprising a superelastic alloy;

coating the particles with a metal coating to form coated particles; and incorporating the coated particles in a matrix comprising a metal solder, wherein the metal coating is wettable by the metal solder.

9. The method according to claim 8, wherein the coating comprises depositing the metal coating on the particles in a chemical bath.

10. The method according to claim 9, wherein the surface of the particles is sensitized by the formation of metal aggregates.

11. The method according to claim 10, wherein the aggregates are based on Sn—Pd, and formed by chemical deposition in corresponding chloride baths.

12. The method according to claim 8, wherein the coating comprises electrolytically depositing the metal coating on the particles.

13. The method according to claim 8, further comprising, before the incorporating step, coating the coated particles with a flux.

14. The method according to claim 8, wherein the particles have a substantially spherical shape with a diameter ranging from 1 to 50 µm approximately.

15. The method according to claim 8, wherein the metal coating has a thickness of less than about 1 µm.

16. The method according to claim 8, wherein the metal coating comprises a metal selected from the group consisting of Cu, Ni, Au, Sn, Ag and Pb.

17. The method according to claim 8, wherein the particles represent about 5% to 30% of the total volume of the paste.

18. The method according to claim 8, wherein the particles comprise an alloy selected from the group consisting of Ni—Ti, Cu—Zn—Al and Cu—Al—Ni.

19. The solder paste according to claim 1, wherein the particles are wettable by the metal coating.

* * * * *